US010374633B2

United States Patent
Milicevic et al.

(10) Patent No.: US 10,374,633 B2
(45) Date of Patent: Aug. 6, 2019

(54) METHOD AND SYSTEM FOR LDPC DECODING

(71) Applicant: Maxlinear, Inc., Carlsbad, CA (US)

(72) Inventors: Mario Milicevic, Carlsbad, CA (US); Glenn Gulak, Toronto (CA)

(73) Assignee: MAXLINEAR, INC., Carlsbad, CA (US)

( * ) Notice: Subject to any disclaimer, the term of this patent is extended or adjusted under 35 U.S.C. 154(b) by 69 days.

(21) Appl. No.: 15/619,764

(22) Filed: Jun. 12, 2017

(65) Prior Publication Data

US 2018/0013446 A1    Jan. 11, 2018

Related U.S. Application Data

(60) Provisional application No. 62/359,932, filed on Jul. 8, 2016.

(51) Int. Cl.
*H03M 13/11* (2006.01)
*H03M 13/37* (2006.01)
(Continued)

(52) U.S. Cl.
CPC ...... *H03M 13/1174* (2013.01); *H03M 13/112* (2013.01); *H03M 13/114* (2013.01);
(Continued)

(58) Field of Classification Search
CPC .......... H03M 13/1174; H03M 13/112; H03M 13/1122; H03M 13/1128; H03M 13/114;
(Continued)

(56) References Cited

U.S. PATENT DOCUMENTS

2008/0276156 A1* 11/2008 Gunnam ............ H03M 13/1177
714/801
2009/0327847 A1* 12/2009 Shen ................. H03M 13/1151
714/804

(Continued)

OTHER PUBLICATIONS

IEEE 100, The authoritative Dictionary of IEEE Standards Terms, Seventh Edition, IEEE Standards Information Network, IEEE Press, pp. 574, 684, 962, 1030, 1120. (Year: 2000).*

*Primary Examiner* — April Y Blair
*Assistant Examiner* — Dipakkumar B Gandhi
(74) *Attorney, Agent, or Firm* — McAndrews, Held & Malloy, Ltd.

(57) ABSTRACT

A Low-Density Parity-Check (LDPC) decoder and a method for LDPC decoding are provided. The LDPC decoder receives a soft-decision input codeword block in which the probability of a bit being a "0" or a "1" is represented as a log-likelihood ratio (LLR). During LDPC decoding, a sequence of hardware logic units iteratively updates the soft-decision input codeword block until a valid codeword is found or a maximum number of decoding iterations is reached. Each hardware logic unit comprises a check node (CN) update logic unit and a variable node (VN) update logic unit. The CN update logic units are coupled via a closed CN path, and the VN update logic units are coupled via a closed VN path. Aspects of this LDPC decoder alleviate the global routing and energy efficiency challenges of traditional LDPC decoders, to enable multi-rate, multi-Gb/s decoding without compromising error correction performance in next-generation systems and future CMOS technology nodes.

20 Claims, 17 Drawing Sheets

Fig. 4

(51) Int. Cl.
*H03M 13/00* (2006.01)
*H03M 13/53* (2006.01)

(52) U.S. Cl.
CPC ...... *H03M 13/116* (2013.01); *H03M 13/1122* (2013.01); *H03M 13/1128* (2013.01); *H03M 13/3746* (2013.01); *H03M 13/635* (2013.01); *H03M 13/6502* (2013.01); *H03M 13/6505* (2013.01); *H03M 13/6516* (2013.01)

(58) Field of Classification Search
CPC ........... H03M 13/116; H03M 13/3746; H03M 13/635; H03M 13/6502; H03M 13/6505; H03M 13/6516
See application file for complete search history.

(56) References Cited

U.S. PATENT DOCUMENTS

| | | | |
|---|---|---|---|
| 2014/0258806 A1* | 9/2014 | Bao | H04L 1/0043 714/758 |
| 2014/0269992 A1* | 9/2014 | Hong | H04L 27/3405 375/298 |
| 2014/0281128 A1* | 9/2014 | Krishnan | G06F 12/0246 711/103 |
| 2014/0351671 A1* | 11/2014 | Liu | H03M 13/1105 714/763 |
| 2015/0052413 A1* | 2/2015 | Eleftheriou | H03M 13/1108 714/758 |
| 2015/0058693 A1* | 2/2015 | Wilson | G11B 20/1833 714/758 |

* cited by examiner

Quasi-Cyclic Parity-Check Matrix  $H = \begin{pmatrix} I_2 & I_1 & 0 \\ I_0 & I_1 & I_2 \end{pmatrix}$ Expanded Binary Parity-Check Matrix $H = $ [expanded binary matrix shown with Column 0, Column 1, Column 2; rows labeled $VN_0$–$VN_8$; check nodes $CN_0$–$CN_2$ (Layer 0) and $CN_3$–$CN_5$ (Layer 1); Bypass Routing Required for All-Zero Sub-Matrix highlighted]

Expansion Factor $q = 3$

\# VN / Col = \# Processing Nodes / Col Slice = 3
\# Layers = \# CN+VN / \# Processing Nodes = 2

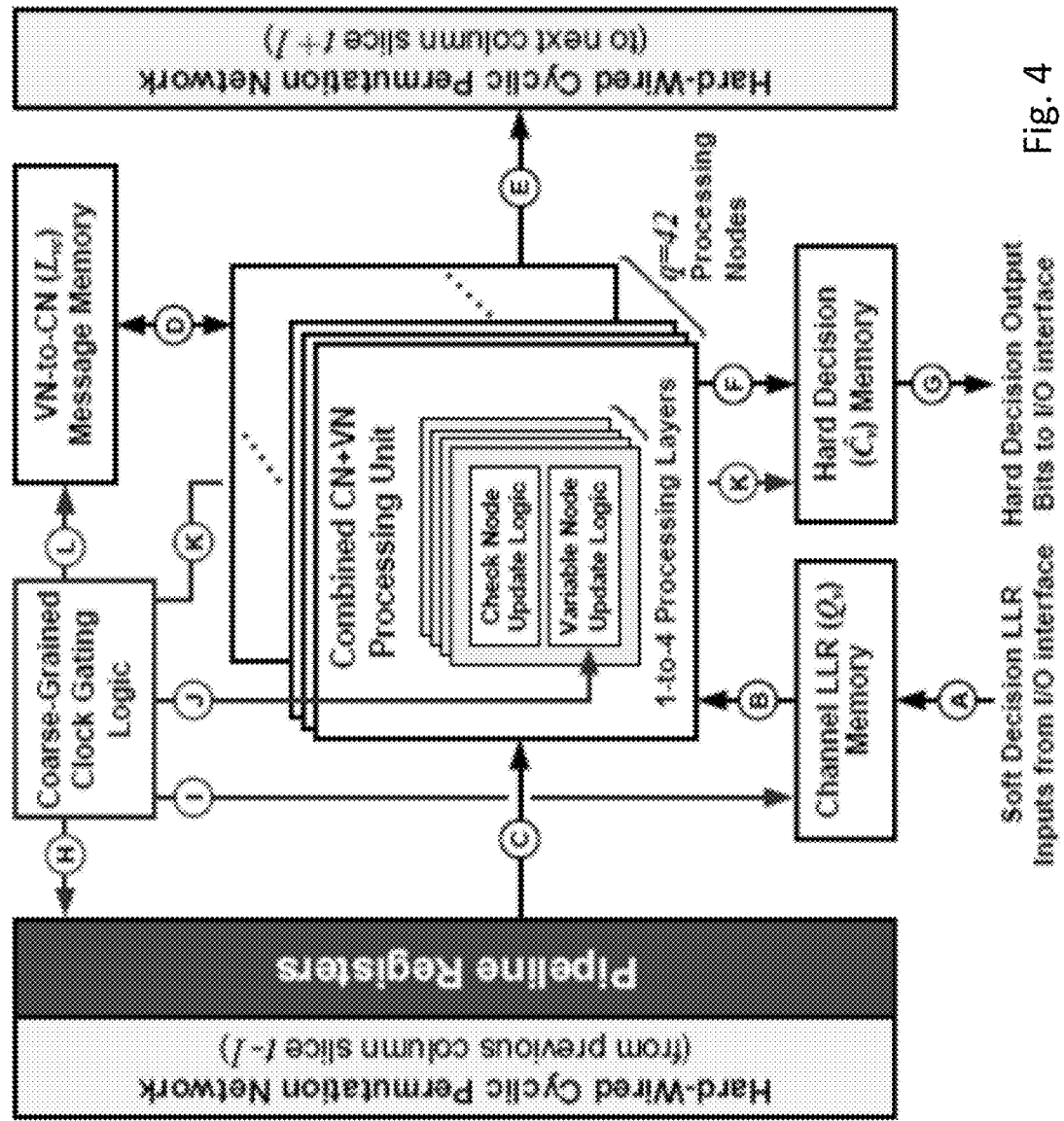

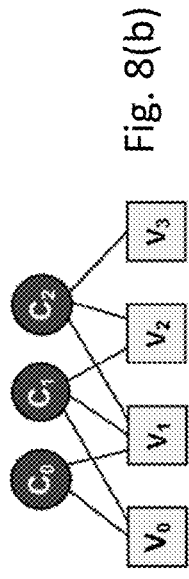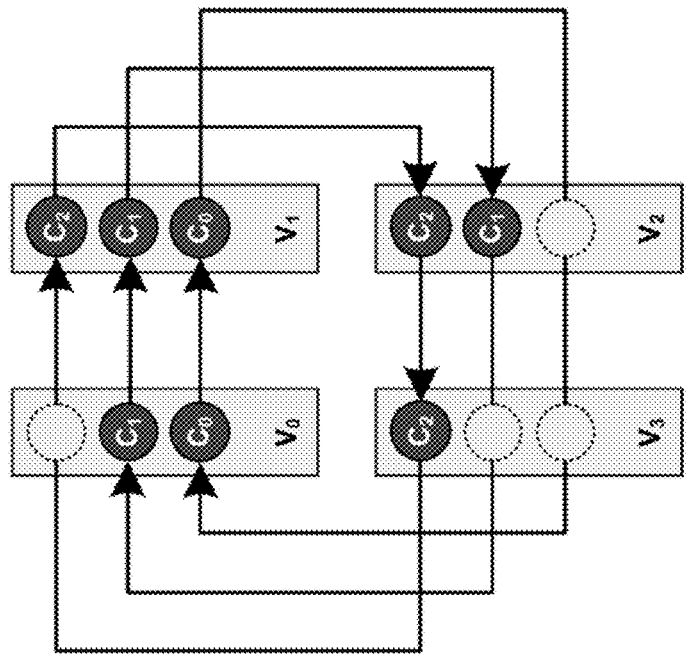

Fig. 9

METHOD AND SYSTEM FOR LDPC DECODING

CROSS-REFERENCE TO RELATED APPLICATIONS

This patent application claims priority to and benefit from of the U.S. Provisional Patent Application No. 62/359,932, filed on Jul. 8, 2016. The above identified application is hereby incorporated herein by reference in its entirety.

BACKGROUND

Limitations and disadvantages of conventional methods and systems for LDPC decoding will become apparent to one of skill in the art, through comparison of such systems with some aspects of the present invention as set forth in the remainder of the present application with reference to the drawings.

BRIEF SUMMARY

Systems and methods are provided for LDPC decoding, substantially as shown in and/or described in connection with at least one of the figures, as set forth more completely in the claims.

Advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 1(a) is an example LDPC parity-check matrix.

FIG. 2(a) is an LDPC parity-check matrix for a rate 1/2 code specified by the IEEE 802.11ad standard with bypass routing identified.

FIG. 2(b) is an LDPC parity-check matrix for a rate 5/8 code specified by the IEEE 802.11ad standard with bypass routing identified.

FIG. 4 is an example column slice circuit comprising 42 combined processing nodes, local memory, and hard-wired cyclic permutation networks between adjacent column slice circuits.

FIG. 8(a) is another example LDPC parity-check matrix.

FIG. 8(b) is a Tanner graph that corresponds to the LDPC parity-check matrix of FIG. 8(a).

FIG. 8(c) is a decoder operable to decode data that is encoded according to the LDPC parity-check matrix of FIG. 8(a).

FIG. 9 is a table of the piecewise time-distributed reformulation of the Min-Sum algorithm with a flooding schedule for a single layer routing path.

DETAILED DESCRIPTION

Figure 1B:
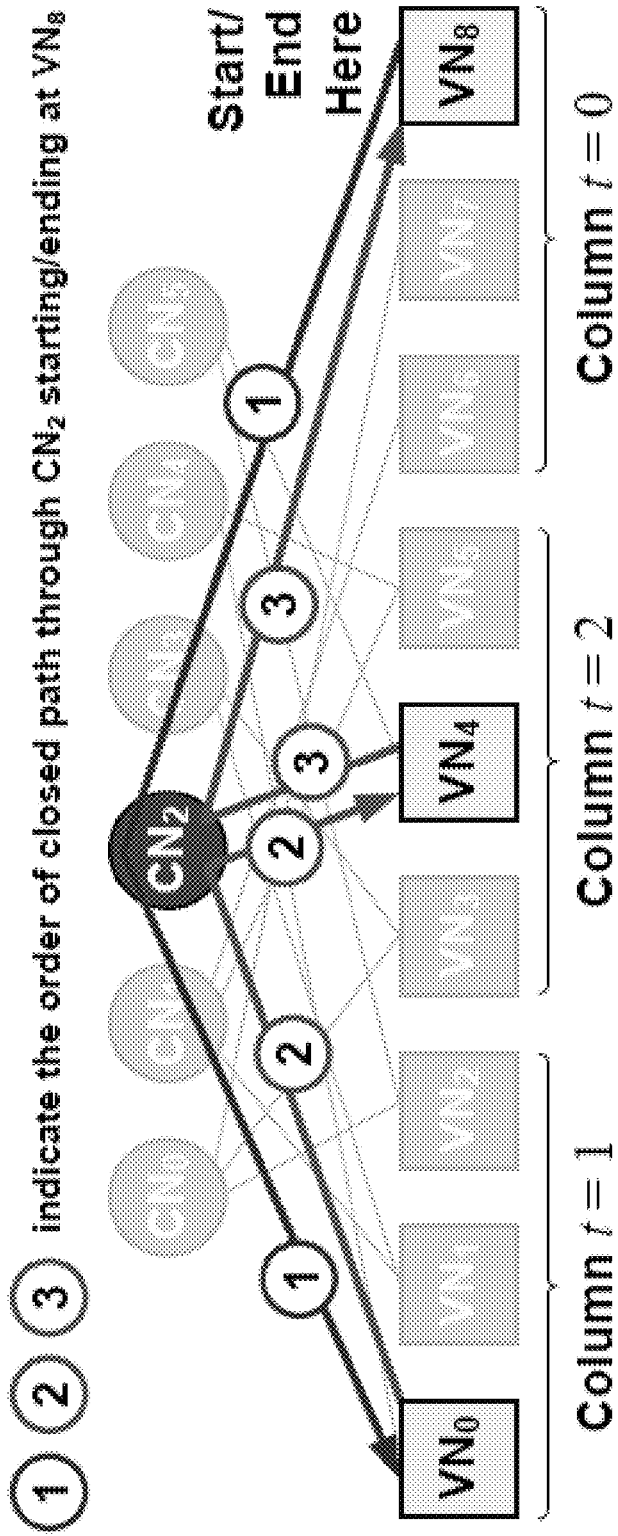
FIG. 1(b) is a Tanner graph that corresponds to the LDPC parity-check matrix in FIG. 1(a).

Although combinational logic and transistor densities continue to scale in modern CMOS technology nodes, interconnect scaling has stagnated around the 45 nm node and is currently a limiting factor in high-speed circuit design. This presents particular challenges for integrated circuit Low-Density Parity-Check (LDPC) decoders and other implementations that require highly complex routing networks between memory and parallel processing units. Aspects of this disclosure are directed to a frame-interleaved LDPC decoder architecture, which exploits the cyclic structure of the LDPC parity-check matrix through a new interconnect partitioning scheme and time-distributed Min-Sum decoding schedule.

The growing demand for high data rate and error-free communication in bandwidth-limited systems has placed stringent performance requirements on forward error correction (FEC) circuits at the physical network layer. Due to their near-Shannon limit error correction performance, Low-Density Parity-Check (LDPC) codes have been widely adopted over the past 15 years in wireless, wireline, optical and non-volatile memory systems. The LDPC encoder is specified in standards such as ETSI DVB-S2X, IEEE 802.11ac (Wi-Fi), IEEE 802.15.3c (WPAN), and IEEE 802.11ad (WiGig). However, the corresponding LDPC decoder architecture for these standards is left to the designer.

LDPC codes are a class of linear block codes, defined by a sparse parity-check matrix and decoded using an iterative belief propagation algorithm with linear time complexity. Aspects of this disclosure are directed to a new, memory-based LDPC decoder architecture, which supports multiple code rates and achieves multi-Gb/s throughput by exploiting the quasi-cyclic structure of the LDPC parity-check matrix, while also reducing interconnect complexity and routing logic overhead. The IEEE 802.11ad standard for the 60 GHz channel is used as a vehicle to demonstrate the application of an exemplary architecture due to its unique parity-check matrix construction, and multi-rate, multi-Gb/s throughput specification. Decoders for other linear block codes are within the scope of this disclosure.

Aspects of this disclosure are directed to new architectural and scheduling techniques that may provide insight on how to alleviate the global routing and energy efficiency challenges in traditional LDPC decoders, to enable multi-rate, multi-Gb/s decoding without compromising error correction performance in next-generation systems and future CMOS technology nodes.

An inefficient LDPC decoder implementation may achieve multi-Gb/s decoding throughput at the expense of complex interconnect and permutation logic, high clock rates, and/or reduced error correction performance. Many baseband digital signal processors (DSP) or systems-on-chip (SoC) operate at clock frequencies in the 200 MHz region at nominal supply voltage and impose tight latency constraints between successive blocks in the receiver chain, and demand multi-rate coding support. Achieving multi-Gb/s decoding throughput under these conditions is a challenge using traditional techniques, especially for short LDPC block lengths like those defined by the IEEE 802.11ad and IEEE 802.15.3c standards.

An embodiment of this disclosure describes system-level considerations of integrating a scalable, multi-rate, multi-Gb/s LDPC decoder in a baseband DSP or SoC operating at 200 MHz, using standard CMOS technology for optimal cost and reliability, while providing acceptable error correction performance at a maximum of 10 decoding iterations with low latency.

FIG. 1(a) shows an example LDPC parity-check matrix. In FIG. 1(a), the quasi-cyclic (QC) parity-check matrix, H, is defined by a matrix, each element of the matrix corresponds to a submatrix. Each row of the QC parity-check matrix corresponds to a processing layer. Each column of the QC parity-check matrix corresponds to a processing column.

In FIG. 1(a), the QC parity-check matrix comprises 2×3 elements, each element corresponding to an Identity matrix, a shifted Identity matrix, or a zero matrix. In FIG. 1(a), the submatrix, $I_0$, is a 3×3 Identity matrix; the submatrix, $I_1$, is the 3×3 Identity matrix cyclically shifted by 1 element; and the submatrix, $I_2$, is the 3×3 Identity matrix cyclically shifted by 2 elements. The extended binary parity-check matrix is generated by substituting the submatrices for the elements of the QC parity-check matrix. Each row of the extended binary parity-check matrix corresponds to a check node. Each column of the extended binary parity-check matrix corresponds to a variable node. The number of variable nodes per column is the expansion factor. In FIG. 1(a), the expansion factor is 3.

The belief propagation message-passing algorithm attempts to converge on a valid decoded codeword by iteratively exchanging messages between two sets of computational update nodes: variable nodes (VNs) and check nodes (CNs), which are explicitly defined by the columns and rows of an LDPC parity-check matrix, as shown in FIG. 1(a).

FIG. 1(b) shows a Tanner graph that corresponds to the exemplary LDPC parity-check matrix in FIG. 1(a). A "1" value located at (x, y) in the extended binary parity-check matrix of FIG. 1(a) indicates a connection between $CN_x$ and $VN_y$ in the Tanner graph of FIG. 1(b). Often visualized by a Tanner graph, the non-zero entries of the binary parity-check matrix define the connections for message passing between VNs and CNs, as shown in FIG. 1(b). Each binary bit of the decoding codeword block corresponds to a single VN, and iterative message passing is performed until the parity check across all CNs is satisfied.

The traditional Sum-Product belief propagation algorithm for LDPC decoding has been shown to achieve error correction performance close to the theoretical Shannon limit, however, due to the non-linearity of its kernel functions, it is not well-suited for hardware implementation. Since its computational result is bounded by the minimum value, the Min-Sum algorithm has instead been widely adopted as a suitable alternative as it does not require look-up tables and can be computed with comparator circuits, while achieving comparable error correction performance.

The LDPC decoder receives its input codeword block from the soft-decision channel slicer, where the probability of each bit being a 0 or 1 is represented as a log-likelihood ratio (LLR), which is then iteratively updated by the decoder until a valid codeword is found, or the maximum number of iterations is reached.

For an Additive White Gaussian Noise (AWGN) channel with noise variance $\sigma^2$ and Binary Phase-Shift Keying (BPSK) modulation, the input LLR, $Q_v$, for VN v, given the received value, $y_v$, can be expressed as $$Q_v \leftarrow \ln\left(\frac{P(x_v = 0 \mid y_v)}{P(x_v = 1 \mid y_v)}\right) = \frac{2y_v}{\sigma^2} \quad (1)$$

where the transmitted bit $x_v$ is a 0 or 1 with equal probability. Given an M×N parity-check matrix, H, defined by M check nodes and N variable nodes, we define the set of VNs connected to CN c as $N(c)=\{v|v\in\{0, \ldots, N-1\}^\wedge H_{vc}\neq 0\}$. In the first message passing iteration, each VN-to-CN message, $L_{vc}$, is initialized to the received channel LLR, $Q_v$, and is transmitted from the VN to all connected CNs. The CN then performs an update with the received VN-to-CN messages, to compute the return CN-to-VN message, $m_{cv}$, which for iteration i is defined as $$m_{cv}^{(i)} \leftarrow \Pi_{v'\in N(c)\setminus v} \text{sgn}(L_{v'c}^{(i-1)}) \times \min |L_{v'c}^{(i-1)}| \quad (2)$$

where the CN message to VN v excludes the message received from VN v in the computation.

In the second phase of the iteration, the VN computes the VN-to-CN message for the next iteration using the received CN-to-VN messages, excluding the $m_{cv}$ message from CN c, such that $$L_v^{(i)} \leftarrow Q_v + \Sigma_{c\in M(v)} m_{cv}^{(i)} \quad (3)$$

The intermediate updated LLR for VN v, $L_v$, is computed as $$L_{vc}^{(i)} \leftarrow Q_v + \Sigma_{c'\in M(v)\setminus c} m_{c'v}^{(i)} \quad (4)$$

and using this expression for $L_v$, the VN-to-CN message from VN v to CN c can also be expressed as $$L_{vc}^{(i)} = L_v^{(i)} - m_{cv}^{(i)} \quad (5)$$

From the intermediate updated LLR, $L_v$, the hard decision bit for each VN, $C_v$, is determined by $$\hat{C}_v^{(i)} \leftarrow \begin{cases} 0 & L_v^{(i)} \geq 0 \\ 1 & \text{otherwise} \end{cases} \quad (6)$$

and the decoded codeword $C=(C_0, C_1, \ldots, C_N)$ is then the concatenated sequence of all hard decision bits.

At the start of the next iteration, a parity check is computed at each CN c, as the XOR of all hard decision bits from those VNs connected to CN c, in the set N(c):

$$p_c \leftarrow \hat{C}_{N(c)_1} \oplus \hat{C}_{N(c)_2} \oplus \ldots \oplus \hat{C}_{N(c)_{|N(c)|}} \quad (7)$$

The early termination condition is satisfied if the parity result $P_c$, at each CN is zero, which indicates that the belief propagation algorithm has converged to a valid codeword. Successive message passing between VNs and CNs continues until the early termination condition is satisfied, or the maximum number of iterations has been reached.

The Min-Sum algorithm can be modified to include scaling factors and offset coefficients to improve decoding performance, as in the case of the Normalized Min-Sum and Offset Min-Sum algorithms, respectively. However, these parameters are strongly dependent on the fixed-point quantization and operating conditions of the LDPC decoder, such as the channel signal-to-noise (SNR) ratio and coding rate, and thus, for optimal performance, should be dynamically adjusted on the fly.

The two-phase schedule of the belief propagation algorithm allows for the direct mapping of CN-phase and VN-phase update computations to explicit CN and VN processing units. This algorithm-to-hardware mapping has been adopted in traditional LDPC decoder implementations, however, it requires all $m_{cv}$ and $L_{vc}$ messages to be routed between the two processing groups through a congested interconnect network, and also introduces complex routing permutation logic in both CN and VN processing units that scales with block length. Furthermore, the $m_{cv}$ computation requires high-order compare-select trees to compute the first and second minimum magnitudes from the received $L_{vc}$ messages, and to select the appropriate return sign and magnitude value for each VN based on the following Min-Sum algorithm simplification in the CN:

$$m_{cv} = \begin{cases} (s_c \times \text{sgn}(L_{vc})) \times \min2_c, & \text{if } \min1_c = |L_{vc}| \\ (s_c \times \text{sgn}(L_{vc})) \times \min1_c, & \text{otherwise} \end{cases} \quad (8)$$

$$s_c = \sum_{v \in N(c)} \text{sgn}(L_{vc}) \quad (9)$$

$$\min1_c = \min_{v \in N(c)} |L_{vc}| \quad (10)$$

$$\min2_c = \min_{v' \in N(c) \setminus \{v_{min1}\}} |L_{v'c}|. \quad (11)$$

Pipeline registers may be required to ease the critical path timing constraints in the aforementioned interconnect and compare-select trees, however, the scalability of the explicitly partitioned CN and VN processing unit approach is still limited.

Embodiments of this disclosure present a new LDPC decoder architecture, which addresses the global routing congestion and scalability problem through a divide-and-conquer approach. An exemplary disclosed LDPC decoder architecture partitions the global message-passing network into structured, local interconnect groups defined between successive columns of the QC parity-check matrix, and introduces a time-distributed decoding schedule, which exploits the spatial locality of update messages by combining the CN-phase and VN-phase update logic into a single processing unit with deterministic memory access. The reformulation of the Min-Sum flooding schedule leverages the QC interconnect structure to minimize routing congestion and permutation logic overhead, while enabling frame-level parallelism for multi-rate, multi-Gb/s decoding.

FIG. 1(b) shows a Tanner graph that corresponds to the exemplary LDPC parity-check matrix in FIG. 1(a). In traditional LDPC decoders where CN and VN processing units are explicitly defined, update messages are iteratively transmitted back and forth between CN and VN processing groups. For the QC parity-check matrix defined in FIG. 1(a), the corresponding Tanner graph is shown in FIG. 1(b), where messages exchanged between connected CNs and VNs trace a closed path along the graph edges in each decoding iteration. As highlighted in FIG. 1(b), one such path is defined by the following node sequence: $VN_0$-$CN_2$-$VN_4$-$CN_2$-$VN_8$-$CN_2$-$VN_0$.

Instead of computing the CN update $m_{cv}$ message for each VN in an explicit CN processing unit, in one embodiment, the decoding schedule unrolls the CN update in time by distributing the CN computation across all the VNs that participate in the check update. By unrolling the paths in FIG. 1(b), the intermediate $CN_2$ node can be removed by absorbing the CN operation into each of the connected VNs. Because $L_{vc}$ VN-to-CN messages are independent, this modification does not alter the final result of the Min-Sum algorithm, but rather introduces a piecewise calculation of the $m_{cv}$ CN-to-VN message update defined by Equations (8)-(11).

Figure 1C:
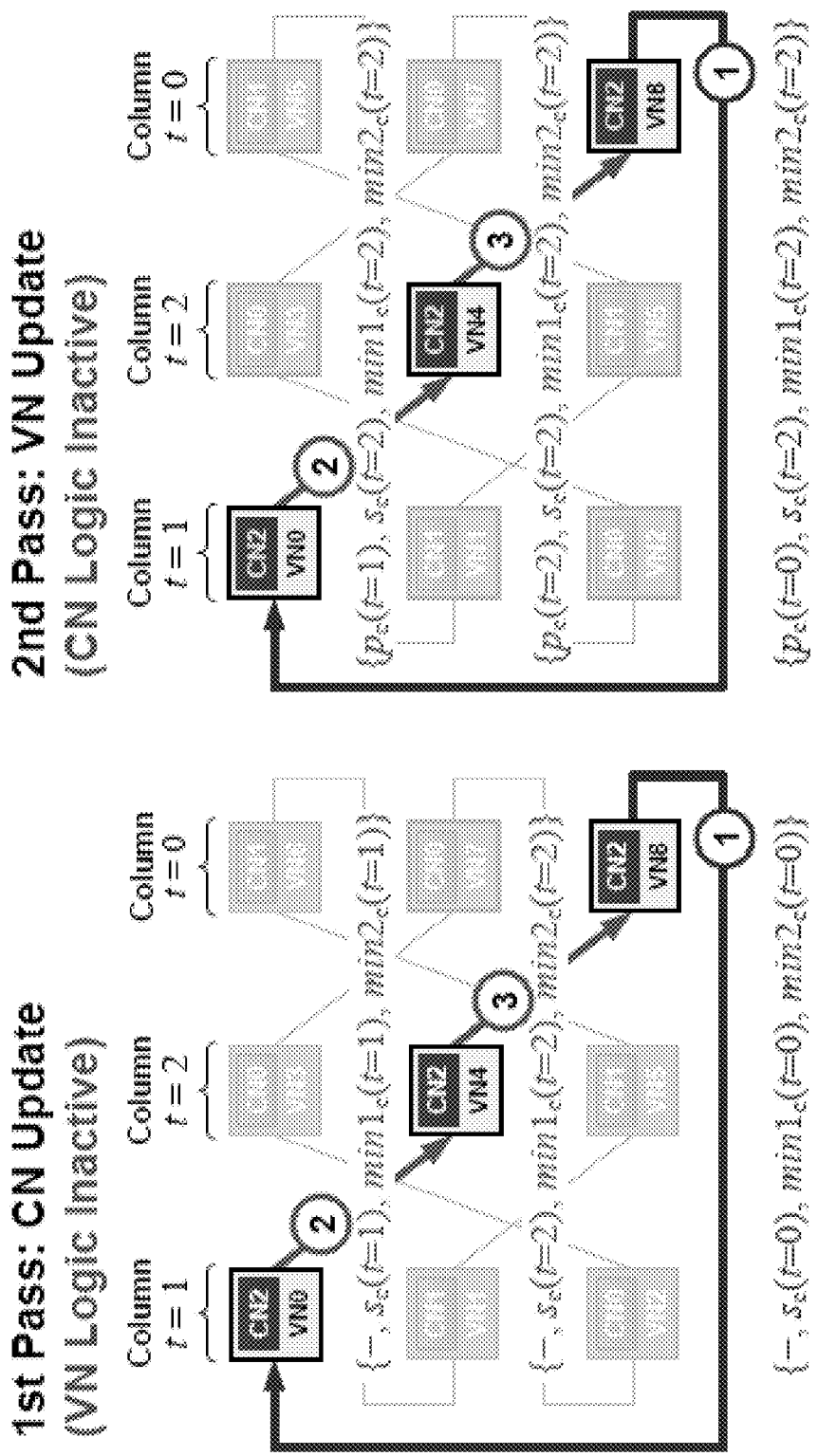
FIG. 1(c) is a first example decoder operable to decode data that is encoded according to the LDPC parity-check matrix of FIG. 8(a).
Figure 1D:
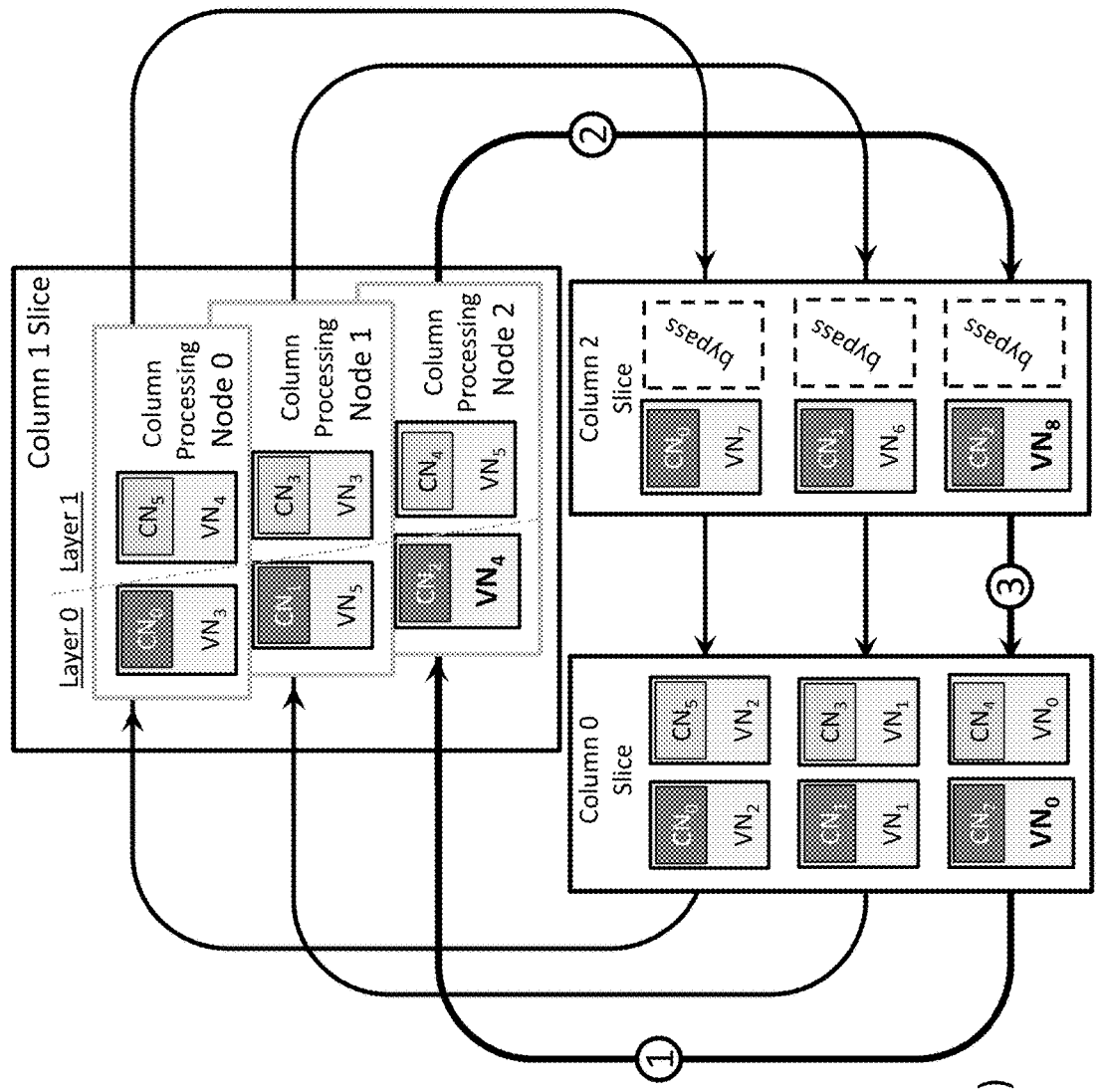
FIG. 1(d) is a second example decoder operable to decode data that is encoded according to the LDPC parity-check matrix of FIG. 8(a).

FIGS. 1(c) and 1(d) present an illustrative example of the interconnect routing patterns and combined processing unit arrangement for an exemplary LDPC decoder architecture. FIG. 1(c) shows that combined processing nodes are arranged in columns, which correspond to the QC columns of the parity-check matrix, and thus maintain the same VN ordering. FIG. 1(c) presents an illustrative example of the interconnect routing patterns and combined processing unit arrangement for an exemplary LDPC decoder architecture. A "1" value located at (x, y) in the extended binary parity-check matrix of FIG. 1(a) indicates a combined processing node $VN_y$+$CN_x$ in FIG. 1(c). For example, the "1" value located at (2, 0) in the extended binary parity-check matrix of FIG. 1(a) indicates a combined processing node $VN_0$+$CN_2$ in the upper left corner of FIG. 1(c). When an element of the QC parity-check matrix of FIG. 1(a) corresponds to the zero matrix, VN+CN processing is not required and may be bypassed as shown on the right of the Layer 1 routing illustration.

FIG. 1(d) presents another illustrative example of the interconnect routing patterns and combined processing unit arrangement for an exemplary LDPC decoder architecture. FIG. 1(d) shows that each combined processing node may comprise more than one layer. As shown in FIG. 1(d), the LDPC decoder may comprise column slice circuits in a pipeline arrangement, each column slice circuit corresponding to a column of the QC parity-check matrix. Each column slice circuit may comprise one or more column processing nodes, the number of column processing nodes per column slice circuit being equal to the expansion factor. Each column processing node may comprise one or more layer processors, each layer processor comprising a combination processing node (VN+CN).

Each combined processing node contains the original VN-update logic defined by Equations (3)-(6), as well as intermediate CN-update logic for the unrolled $m_{cv}$ CN-to-VN message computation. The interconnect structure between combined processing node columns in an exemplary architecture is defined by the cyclic permutation between the connected VNs in adjacent columns. This partitioned network is hard wired, such that all combined processing nodes corresponding to one original CN form a closed path. As highlighted in FIGS. 1(c) and 1(d), the closed path corresponding to the highlighted Tanner graph edges in FIG. 1(b) traces the following path in the example structure: $VN_0$-$VN_4$-$VN_8$-$VN_0$.

In general, for a given QC parity-check matrix, the majority of VNs will be connected to more than one CN, where each CN appears in a separate and independent QC layer. For instance, in FIG. 1(b), $VN_0$ is connected to both $CN_2$ and $CN_4$. Since these two CN updates are independent, their corresponding unrolled paths across the combined processing units are also independent, as each CN is connected to a unique set of VNs. Hence, each layer of the QC parity-check matrix requires an independent routing layer in an exemplary embodiment, as shown by the Layer 0 Routing and Layer 1 Routing patterns in FIG. 1(c). The independent routing layers may be processed in parallel as shown in FIG. 1(d).

This layer-parallel approach realizes the flooding Min-Sum schedule, and thus, each combined processing unit requires independent CN-update logic for each active processing layer. For example, as shown in FIGS. 1(c) and 1(d), the combined processing node corresponding to $VN_0$ contains CN-update logic for both $CN_2$ and $CN_4$ paths, in Layer 0 and Layer 1, respectively.

Bypass routing is required between combined processing node groups in layers where an all-zero sub-matrix appears in the QC parity-check matrix, in order to ensure the continuity of the closed path in the message passing interconnect. In the bypass case, the processing node in the successive column is included in the path, and neither CN-update nor VN-update computations are performed. This introduces an artificial edge into the Tanner graph, such that the number of combined processing nodes in each closed path is equal.

In accordance with an exemplary embodiment, two passes through the structure are required to complete one decoding iteration. The first pass corresponds to the CN-update phase, and the second pass corresponds to the VN-update phase. The mathematical piecewise modification to the flooding Min-Sum algorithm, as a result of the unrolled message passing and distributed computation through the re-mapped interconnect and combined processing node structure, is described below.

As previously discussed, each individual closed routing path in the exemplary architecture corresponds to VN-connectivity for one single CN. By absorbing the CN-update operation among all connected VN processors, the traditional VN-to-CN ($L_{vc}$) and CN-to-VN ($m_{cv}$) messages are not explicitly computed, nor routed through the structure. Instead, the $L_{vc}$ and $m_{cv}$ computations are discretized through a piecewise linear reformulation of the flooding Min-Sum algorithm.

In an exemplary embodiment, the only messages propagated through a closed CN path are the following four intermediate CN-update values: parity, sign, first minimum magnitude, and second minimum magnitude, which correspond to Equations (7), (9), (10), and (11), respectively. These independent components are consumed at each combined processing unit to compute the required $L_{vc}$ and $m_{cv}$ update values as per the Min-Sum definition.

One LDPC decoding iteration is performed through two successive passes along all closed CN paths in the proposed structure. The first pass corresponds to the CN-update phase, during which, the intermediate components required to compute the return $m_{cv}$ value for every VN are determined by traversing the CN path and updating the sign, first minimum magnitude, and second minimum magnitude. Each combined processing unit stores its $L_{vc}$ value, such that when the path traversal hop arrives at that particular node, the $L_{vc}$ value is used to compute the intermediate sign and minimum magnitude updates.

The path traversal then hops to the next connected processing node in the adjacent column, and the updates are repeated until the last column of the structure is reached, at which point, the final sign, first minimum magnitude, and second minimum magnitude for that particular CN have been determined. The second pass corresponding to the VN-update phase now begins. During the second pass, the sign and minimum magnitude values are not updated any further, but rather held constant and broadcast through the CN path to all connected processing units to perform the VN update. During the VN-update phase, each processing unit first computes its own, unique CN-to-VN message, $m_{cv}$, based on Equation (8) using the received sign and minimum magnitude values. The computed $m_{cv}$ value is then used to calculate the intermediate LLR, $L_v$, hard-decision bit, $C_v$, and new VN-to-CN message, $L_{vc}$, according to Equations (4)-(6). The new $L_{vc}$ value will be stored in the processing unit's memory to be used during the CN-phase path traversal in the next iteration. In order to eliminate the explicit parity check step from the CN update, a piecewise parity check update is performed during the VN-phase path traversal, such that the final parity across all connected VNs for a particular CN path is determined by the last column in the traversal, and thus, the parity result from the previous iteration is known immediately at the start of the next iteration's CN-update phase.

The IEEE 802.11ad standard specifies several operating modes with raw bit rates up to 6.7 Gb/s, and a fixed block length of 672 bits for 4 coding rates. However, due to the high free-space path loss of the 60 GHz channel, the error correction requirements are relaxed as co-channel interference is naturally minimized. Nevertheless, the design of a multi-Gb/s LDPC decoder for a short block length with multi-rate support remains a challenge, given the low latency and energy efficiency constraints for multimedia streaming applications across mobile devices. As described below, exemplary architectures in accordance with this disclosure are highly suitable for this standard.

Figures 2A, 2B:
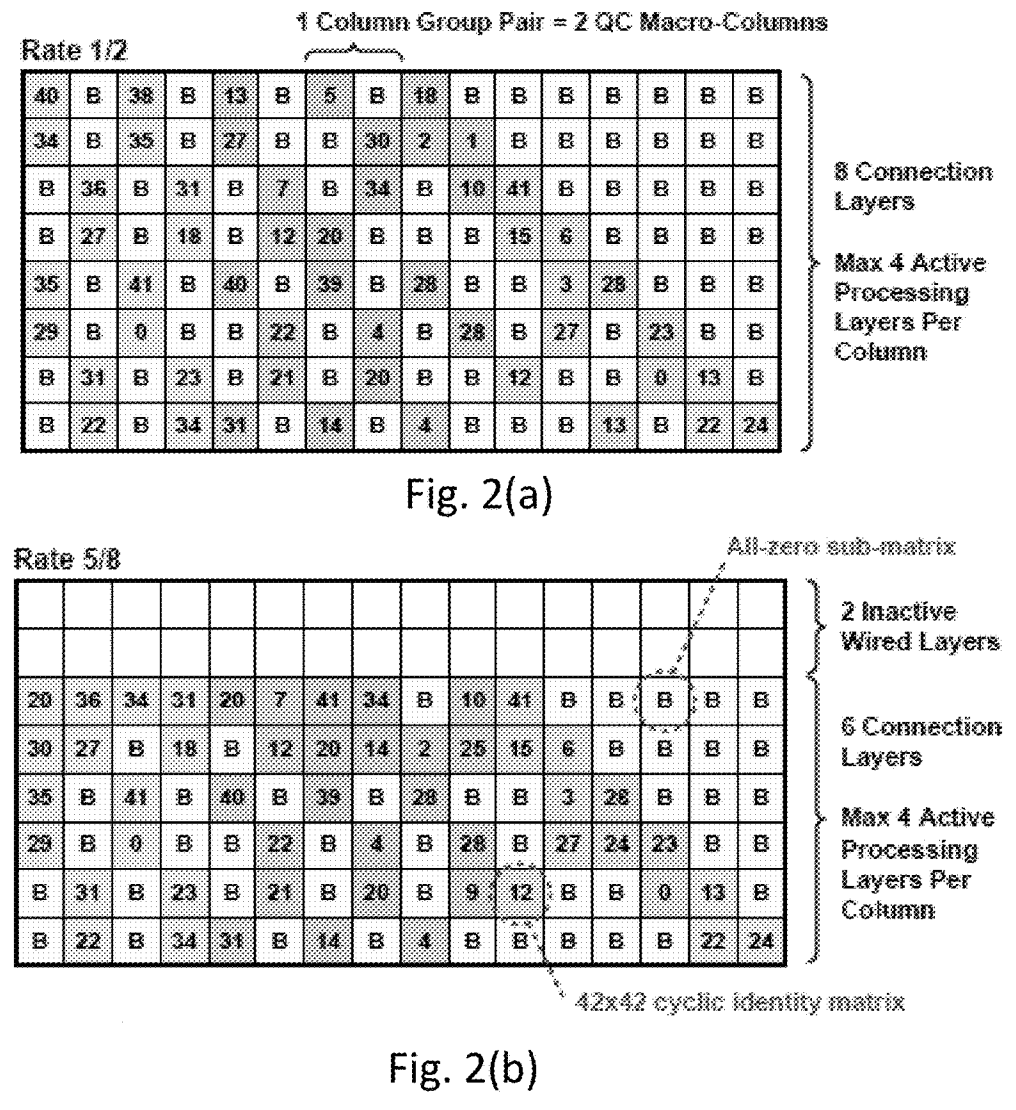
Figure 2C:
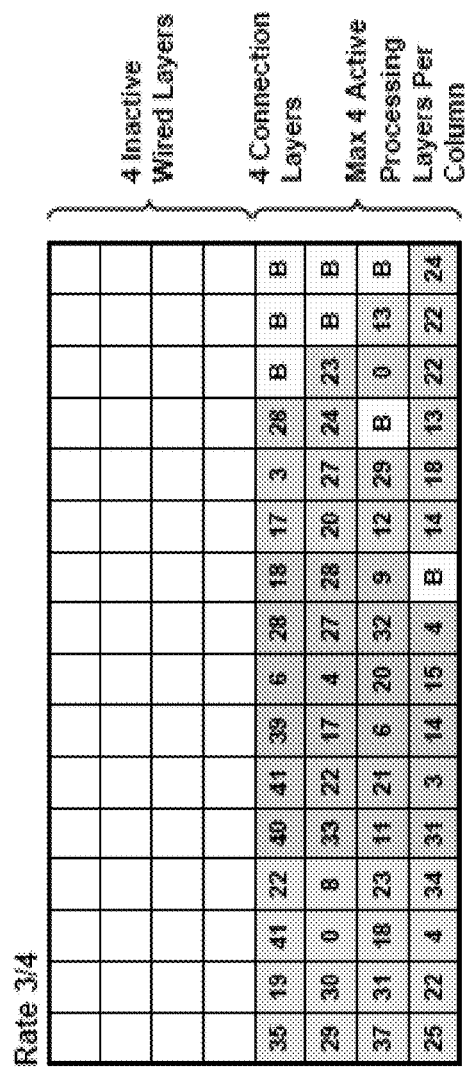
FIG. 2(c) is an LDPC parity-check matrix for a rate 3/4 code specified by the IEEE 802.11ad standard with bypass routing identified.
Figure 2D:
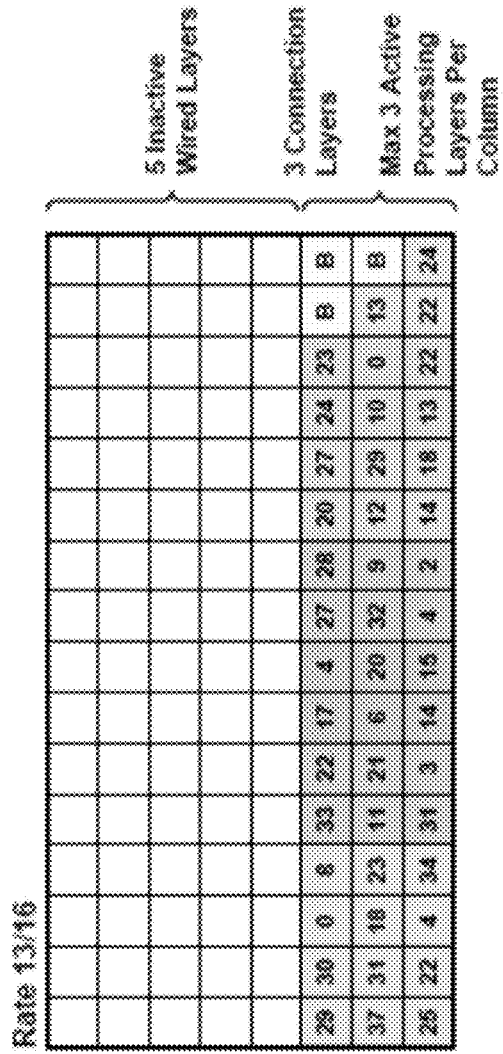
FIG. 2(d) is an LDPC parity-check matrix for a rate 13/16 code specified by the IEEE 802.11ad standard with bypass routing identified.

FIG. 2(a) shows the LDPC parity-check matrix for the rate 1/2 code of the IEEE 802.11ad standard with bypass routing identified. Bypass routing is identified with a "B". FIG. 2(b) shows the LDPC parity-check matrix for the rate 5/8 code of the IEEE 802.11ad standard with bypass routing identified. FIG. 2(c) shows the LDPC parity-check matrix for the rate 3/4 code of the IEEE 802.11ad standard with bypass routing identified. FIG. 2(d) shows the LDPC parity-check matrix for the rate 13/16 code of the IEEE 802.11ad standard with bypass routing identified.

The LDPC parity-check matrix for each of the four code rates of the IEEE 802.11ad standard can be derived from a single base matrix, by removing layers and populating higher-rate matrices with non-zero sub-matrix entries, as shown in FIGS. 2(a-d). Each numerical value in the matrices in FIGS. 2(a-d) indicates the cyclic permutation index of a 42×42 Identity matrix. Each one of the 16 columns in the matrices shown in FIGS. 2(a-d) maps directly to a column in the exemplary architecture shown in FIG. 3, and maintains the same VN ordering such that each re-mapped column contains 42 combined processing nodes. Adjacent columns are connected through hard-wired routing in each of the 8 defined layers, which correspond to 8×42=336 possible CN paths.

Depending on the code rate, only a subset of the total number of layers may be active. For example, the Rate 1/2 code requires all 8×42=336 CN paths, while the Rate 13/16 code only requires 3×42=126 CN paths. Inactive paths are disabled through clock gating to eliminate unnecessary CN-update logic switching and message passing in inactive layers. Parity-check matrix entries corresponding to inactive CN paths are left blank in FIGS. 2(a-d). Bypass routing is required for the proposed architecture in each of the code rates where a zero sub-matrix appears in the parity-check matrix definition. These locations are indicated with a "B" in FIGS. 2(a-d), to ensure that each closed CN path has 16 column/processing node hops. Most importantly, each column in the four parity-check matrices shown in FIGS. 2(a-d) has at most 4 active CN connections, thus each combined processing node requires at most 4 processing layers, where each processing layer contains both CN-update and VN-update logic, as shown in FIG. 4. Processing nodes in the last 4 columns require only 1, 2, or 3 processing layers, due to the lower-triangular matrix construction.

The proposed architecture exploits the QC structure of the IEEE 802.11ad LDPC parity-check matrices by constraining the global routing congestion problem to local interconnect between adjacent columns and applying the proposed time-distributed piecewise Min-Sum decoding schedule over the newly defined processing nodes, which contain both CN-update and VN-update logic. Since each parity-check matrix for each of the four code rates is derived from a single base matrix, the multi-rate functionality is built-in to the hard-wired cyclic permutation networks between adjacent columns, thus eliminating the need for additional permutation and control logic to switch between rates. As the decoder switches from a low-rate code to a high-rate code, the appropriate interconnect layers are disabled, however, hardware utilization remains high due to the constant number of active processing layers among the four rates in the combined processing nodes.

Figure 3A:
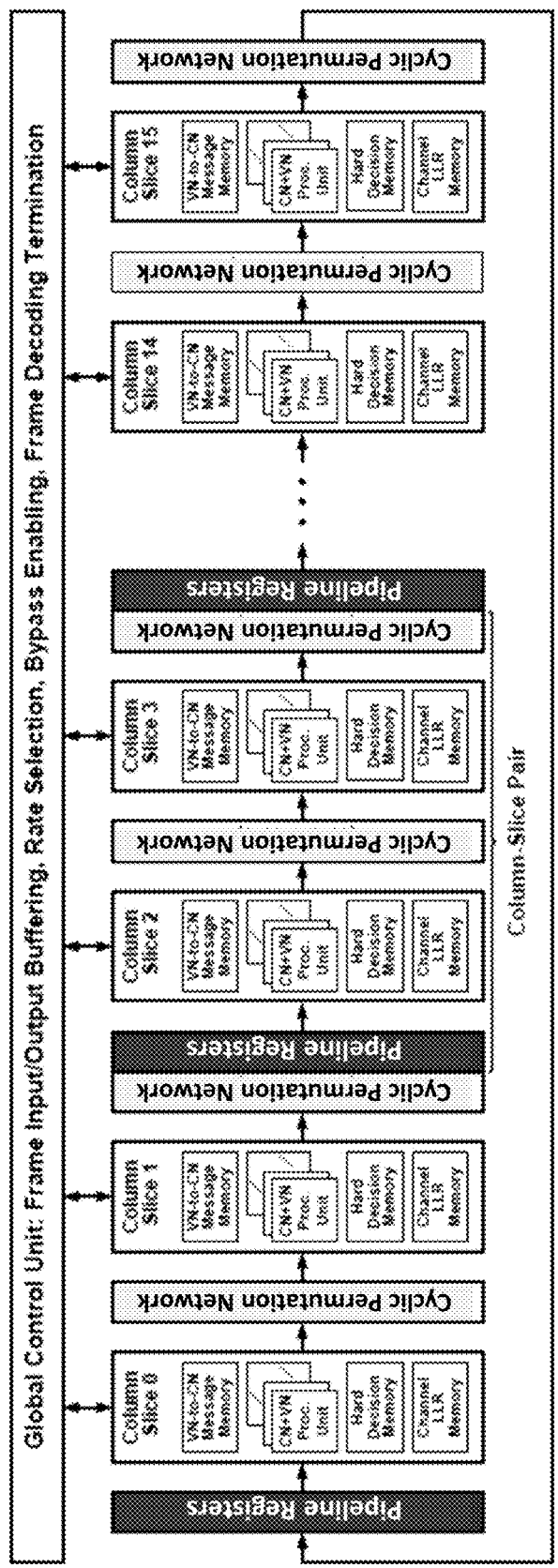
FIG. 3(a) is an example decoder operable to decode data that is encoded according to the LDPC parity-check matrices of FIGS. 2(a-d).

FIG. 3(a) shows an example LDPC architecture operable to process the 16-column matrices shown in FIGS. 2(a-d). The LDPC architecture of FIG. 3(a) comprises column slices with combined processing nodes and memory, hard-wired cyclic permutation networks, pipeline registers between column slice pairs, and control unit for input-output frame buffering, rate selection, and bypass selection.

Since the number of columns is fixed for all four code rates, the constant workload of the time-distributed piecewise decoding schedule enables message pipelining between adjacent columns. As shown in FIG. 3(a), pipeline registers are placed between every two column slices instead of every adjacent column slice to satisfy the decoding latency requirement of the IEEE 802.11ad standard. Since the computation in each column is independent, and a constant number of hops is required to traverse each closed path, in-dependent decoding frames can be interleaved in the structure without any memory access contention.

Figure 3B:
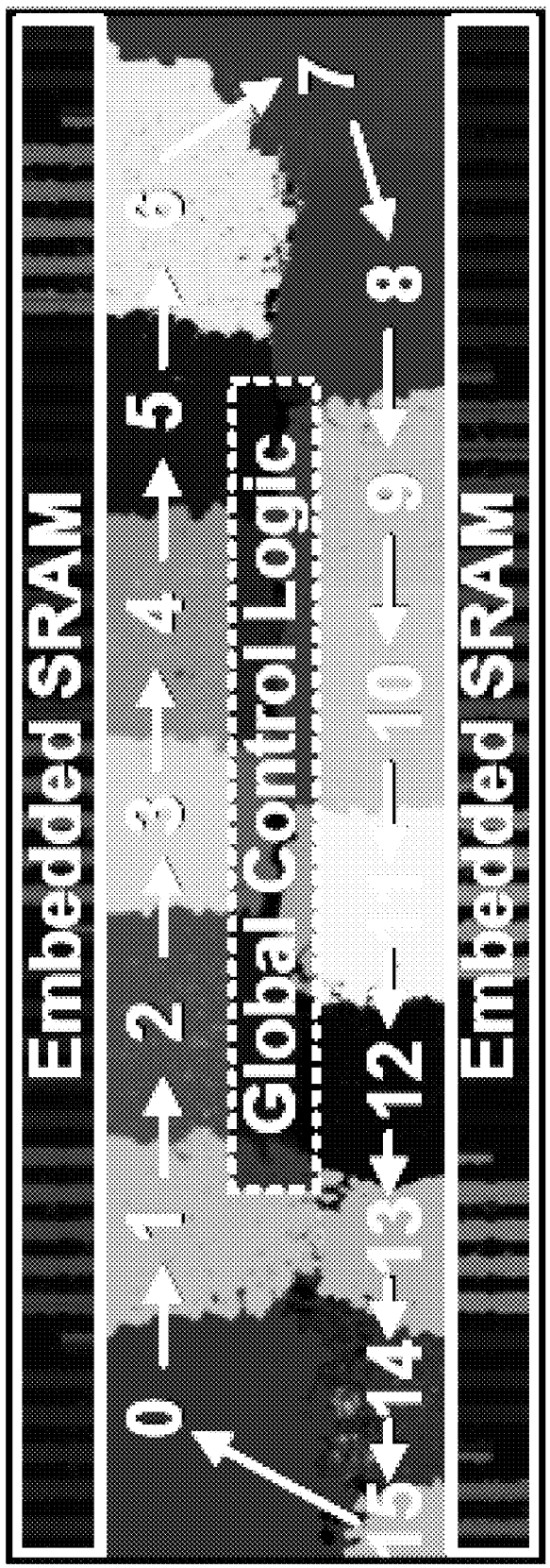
FIG. 3(b) is an example placement of the column slice circuits in the decoder of FIG. 3(a).

FIG. 3(b) shows an example placement of the column slices in the LDPC architecture of FIG. 3(a). Each column slice is adjacent to a previous column slice and a next column slice. Since there are a total of 16 column slices, column slice 15 is adjacent to column slice 0.

Figure 5:
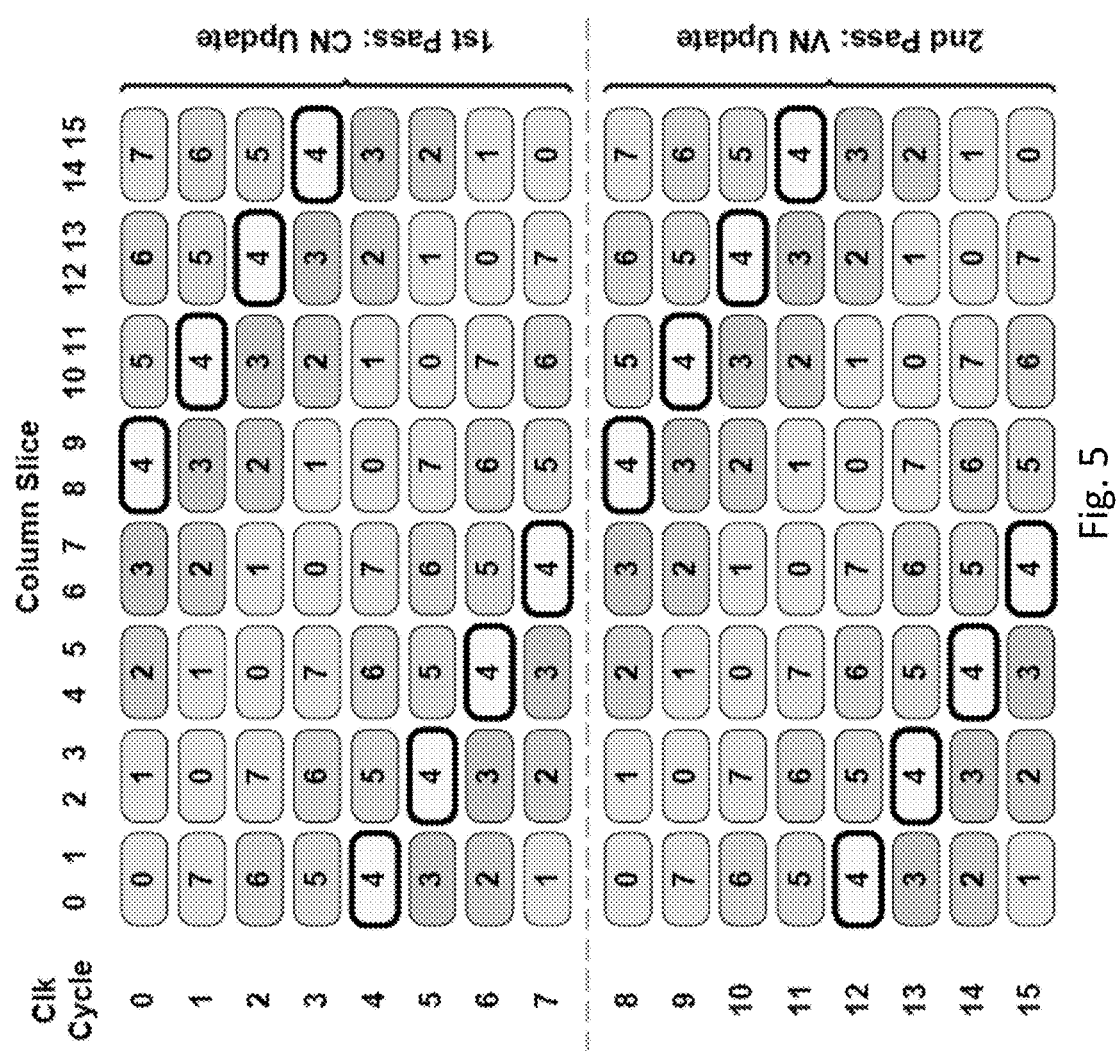
FIG. 5 is an example frame interleaving schedule for decoding frames that are encoded according to the IEEE 802.11ad standard.

FIG. 5 presents a frame interleaving schedule for the IEEE 802.11ad standard. FIG. 5 illustrates a pipelined frame interleaving pattern among column slices. One complete LDPC decoding iteration for the IEEE 802.11ad standard may be processed over 16 clock cycles. During a clock cycle, a first frame is processed by a first pair of column slice circuits. During a next clock cycle, the first frame is processed by a second pair of column slice circuits and a second frame is processed by the first pair of column slice circuits. This process continues, and the first a first pair of column slice circuits follow the eighth pair of column slice circuits. An LDPC decoding iteration may comprise processing by all eight pairs of column slice circuits twice.

Pipelined frame interleaving is required to achieve the multi-Gb/s decoding throughput specification for the IEEE 802.11ad standard. FIG. 5 presents the frame interleaving schedule for the IEEE 802.11ad standard, where 8 frames are cyclically interleaved across 16 columns. The frames are sequentially pipelined through the interconnect and column slice structure, where a single frame is updated and routed through two columns in each clock cycle. Both CN-update and VN-update phases require 8 clock cycles to complete, thus a total of 16 cycles are required to complete a single decoding iteration across all 8 interleaved frames. Since each frame is independent, the frame-interleaved decoding schedule ensures full hardware utilization of all processing nodes, and does not require any pipeline stall cycles.

For a fixed number of iterations, the minimum decoding throughput and maximum latency of a frame-interleaved LDPC decoder can be determined using the following two equations:

$$\text{Throughput} = \frac{N_{frames} \times N_{block} \times f_{clk}}{N_{iterations} \times N_{cycles\text{-}per\text{-}iteration}} \quad (12)$$

$$\text{Latency} = \frac{N_{iterations} \times N_{cycles\text{-}per\text{-}iteration}}{f_{clk}}. \quad (13)$$

For a block length of 672 bits, in accordance with an exemplary LDPC decoder architecture, operating at a 200 MHz clock frequency with 10 decoding iterations and 8 interleaved frames, achieves a throughput of 6.72 Gb/s and latency of 0.8 µs, which satisfy the performance requirements of the IEEE 802.11ad standard.

FIG. 4 shows a column slice circuit comprising 42 combined processing nodes (each containing 1-to-4 active processing layers), local memory, and hard-wired cyclic permutation networks between adjacent column slice circuits. An incoming connection layer message, from a previous column slice circuit, may comprise a data word for each active layer processor within each column processing node. Likewise, an outgoing connection layer message, sent to a next column slice circuit, may comprise a data word for each active layer processor within each column processing node. The data word may comprise a parity bit, a sign bit, a first minimum magnitude, and a second minimum magnitude. The first minimum magnitude and the second minimum magnitude may be, for example, 5 bits.

The local memory may comprise VN-to-CN ($L_{vc}$) message memory, channel LLR ($Q_v$) memory, and hard decision ($C_v$) memory. The $L_{vc}$ message memory may comprise storage for an $L_{vc}$ value for all active layers for each of the processing nodes over all independent frames. The $Q_v$ memory may comprise storage for a soft decision value for all active layers for each of the processing nodes over two sets of independent frames. The $C_v$ memory may comprise storage for a hard decision value for all active layers for each of the processing nodes over two sets of independent frames. The $L_{vc}$ message memory and the $Q_v$ memory may each utilize a dual-port memory register file. The $C_v$ memory may utilize a single-port memory register file.

The frame sequencing control is intrinsically embedded in the hard-wired interconnect between adjacent column slices. The cyclic memory addressing pattern in each column slice results in conflict-free memory access and eliminates the need for additional control overhead. As shown in FIG. 4, dual-port memories are required in each column slice to store the intermediate $L_{vc}$ update messages, channel LLRs, and hard decision bits. All three memory blocks use the same address, which corresponds to the index of the current frame in the column slice. Each $L_{vc}$ memory stores the $L_{vc}$ values for all 4 active layers for each of the 42 processing nodes over 8 independent frames, thus each word contains all 4×42=168 $L_{vc}$ values for a particular frame. During the CN-update phase, $L_{vc}$ values for the current frame are read out, and during the VN-update phase, $L_{vc}$ values from the previous frame are written at the previous frame address, while $L_{vc}$ values for the current frame are read out.

Figure 6A:
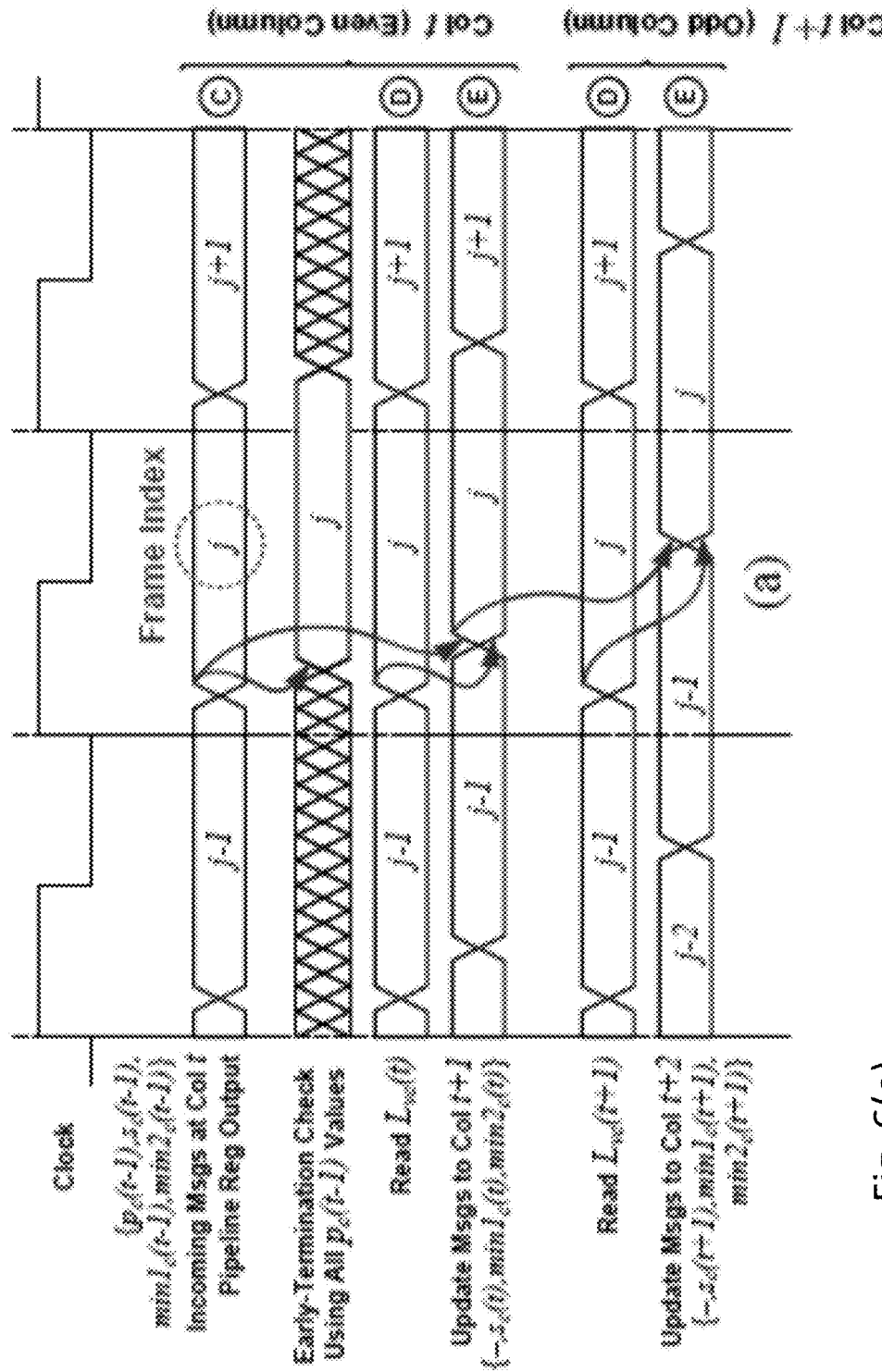
FIG. 6(a) is a timing diagram for the CN-update phase of a single frame processed over two adjacent columns in one clock cycle.
Figure 6B:
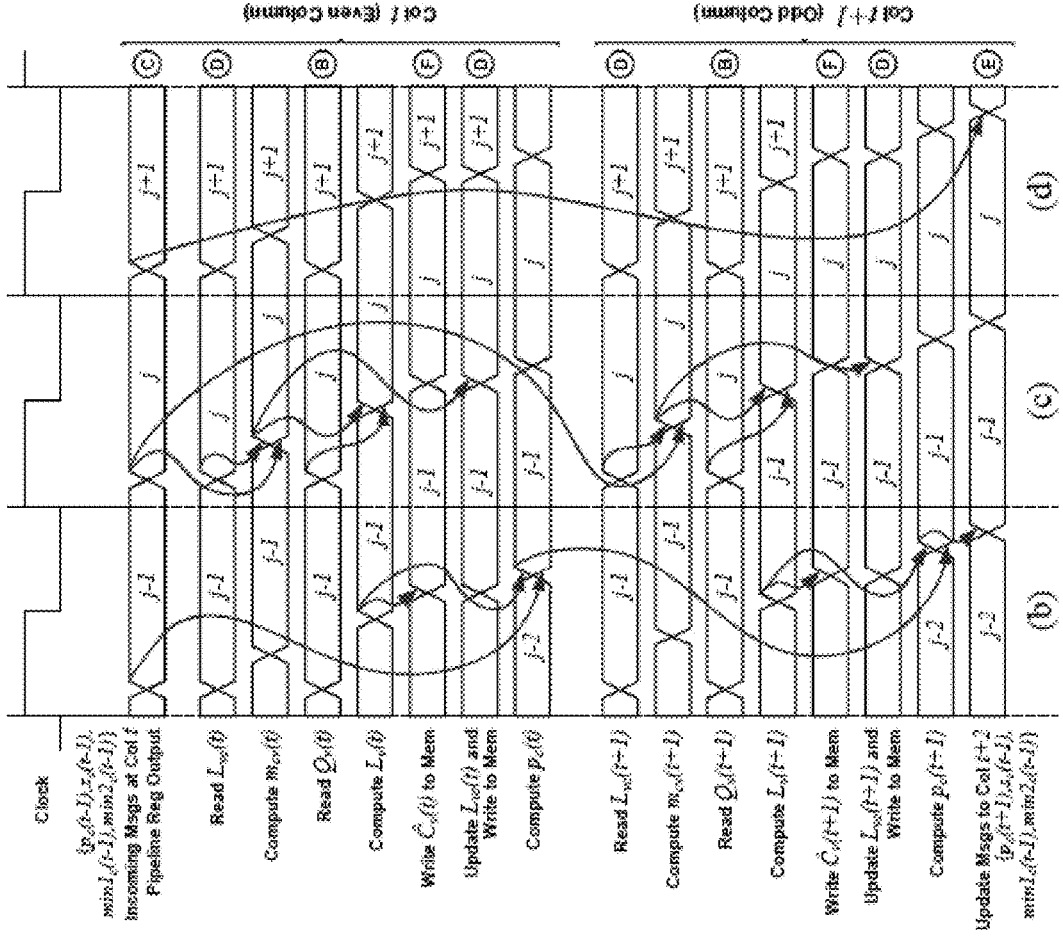
FIG. 6(b) is a timing diagram for the VN-update phase of a single frame processed over two adjacent columns in one clock cycle.

FIG. 6(a) illustrates a column processing node timing diagram for a single decoding frame over two adjacent columns in one clock cycle for a CN-update phase. FIG. 6(b) illustrates a column processing node timing diagram for a single decoding frame over two adjacent columns in one clock cycle for a VN-update phase. The critical path is constrained in the VN-update phase due to the additional $m_{cv}$, $L_v$, $L_{vc}$, and parity computations, however, the unidirectional cyclic interconnect between adjacent column slices reduces routing complexity by eliminating the need for forward and reverse routing channels.

The channel LLR and hard decision memories are dual-ported to enable input/output frame buffering such that there are no idle decoding cycles. While the current 8 frames are being shuffled and updated, the next 8 frames are preloaded and buffered into the channel LLR memory, such that once the current 8 frames terminate, the decoder seamlessly restarts the decoding process with the next 8 frames. Decoded codewords in the hard decision ($C_v$) memory are then buffered out. In this way, the frame input/output buffering does not interrupt the massively parallel frame-interleaved decoding schedule. Both channel LLR and hard decision memories in a single column slice store their respective values for all 16 frames for the 42 processing nodes. Furthermore, the low throughput operating modes for the IEEE 802.11ad standard are supported through frame buffering, while running the decoder core at the full clock rate, instead of using frequency scaling techniques, which increase clock control and distribution complexity.

An exemplary disclosed frame-interleaved LDPC decoder architecture achieves a high degree of computational parallelism during the pipelined decoding schedule, as all combined processing nodes maintain a constant, maximum workload. The frame-independent processing among column pairs allows frames of different code rates to be decoded simultaneously, at the same throughput without any additional control overhead, since the primary rate control mechanism is embedded in the hard-wired cyclic interconnect between adjacent columns. This partially-parallel architecture can be classified as both row-parallel or column-parallel, due to the pipelined frame-parallel decoding schedule, which achieves the goal of reducing interconnect complexity and permutation logic overhead by exploiting the cyclic pattern between adjacent columns and combining the CN-update and VN-update computations into a single processing node.

Figure 7A:
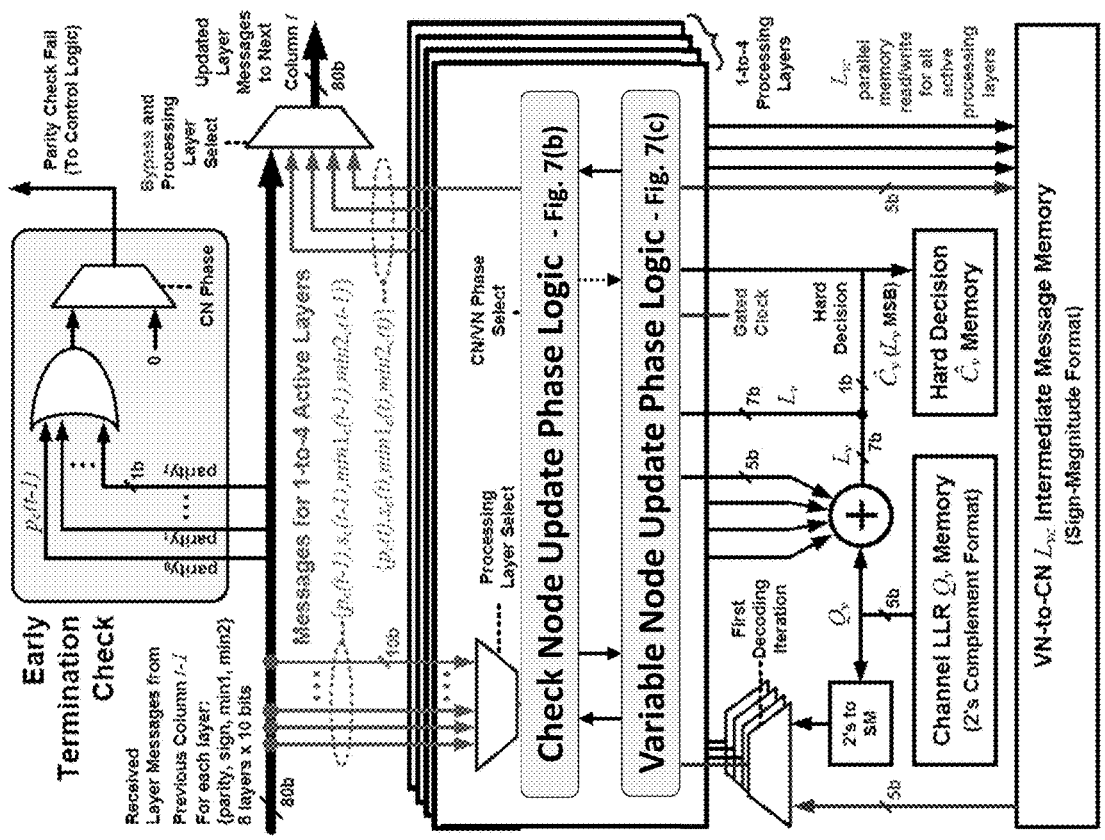
FIG. 7(a) is an example combined processing node.
Figure 7B:
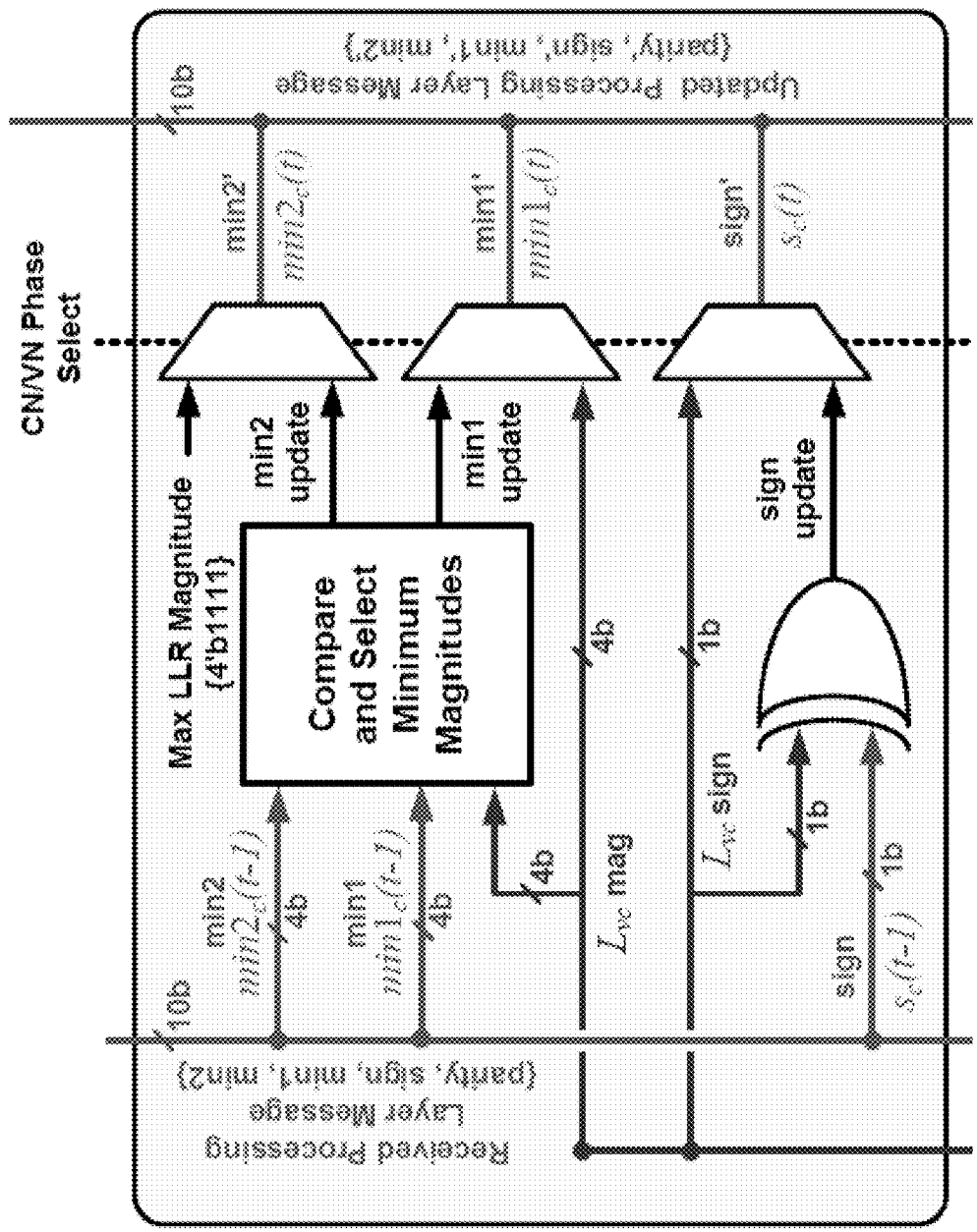
FIG. 7(b) is an example CN update phase logic circuit within the combined processing node of FIG. 7(a).
Figure 7C:
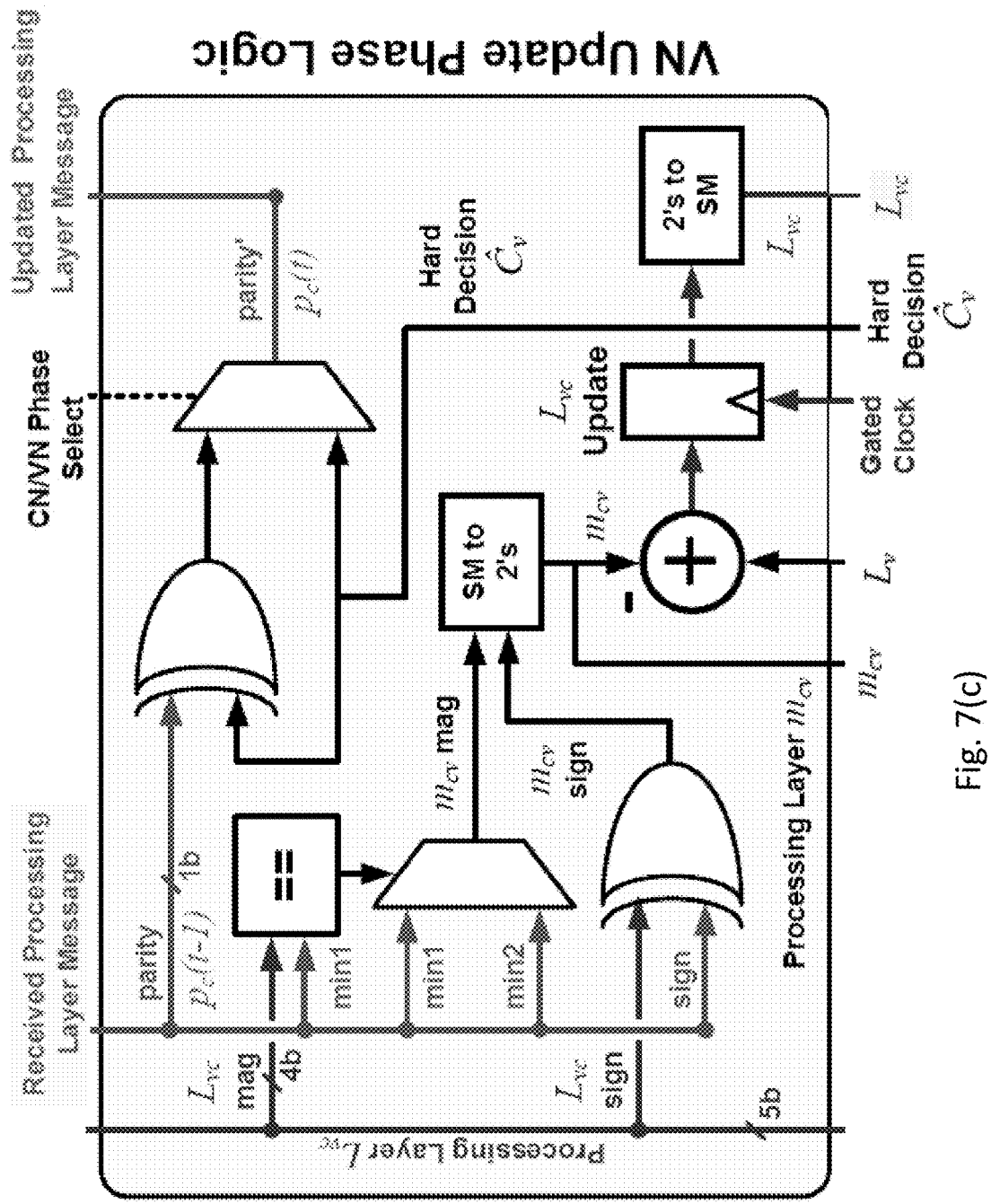
FIG. 7(c) is an example VN update phase logic circuit within the combined processing node of FIG. 7(a).

The combined processing node shown in FIGS. 7(a-c) is comprised of combinational logic for the CN-update and VN-update phases. FIG. 7(a) shows an example combined processing node. FIG. 7(b) shows an example CN update phase logic circuit. FIG. 7(c) shows an example VN update phase logic circuit.

The memory and layer message routing interfaces are shared by both sets of logic to realize the time-distributed flooding Min-Sum decoding schedule.

One aim is to exploit the spatial locality of data by placing the memory as close as possible to the processing node in order to minimize routing complexity and read/write delay by eliminating the need for data shifting logic. Since the architecture ensures a constant number of message hops, parity-check matrix re-ordering and modifications are not required, thereby allowing each processor to interface directly with the input/output ports of the associated memory blocks without additional interface permutation circuits.

The time-distributed piecewise decoding schedule eliminates the complex, timing-constrained compare-select and XOR trees, which were previously required for minimum magnitude, sign, and parity computations. In the CN-update phase, the minimum magnitude comparison only requires a single compare-select circuit between the propagated first and second minimum values, and a single XOR gate for sign calculation. Similarly, in the VN-update phase, the parity check computation is also reduced to a sequential XOR update, and the $m_{cv}$ value is instead computed independently in each VN. This architecture relaxes the critical path timing constraints to enable pipelined frame interleaving.

Furthermore, the single-clock design reduces the clock distribution complexity and ensures consistent timing closure between pipeline registers and memory during the standard cell synthesis and place-and-route design flow.

Early termination is performed once the parity check update indicates that the decoder has converged to a valid codeword. An exemplary early termination strategy is to wait until all decoding frames have terminated, before buffering in the next set of frames. This approach requires only one iteration counter for all frames in the architecture, thus reducing the complexity of early termination monitoring and frame buffering. Frames that converge to a valid codeword in fewer iterations than other interleaved frames, continue to iterate until all remaining frames have converged.

Figure 9:
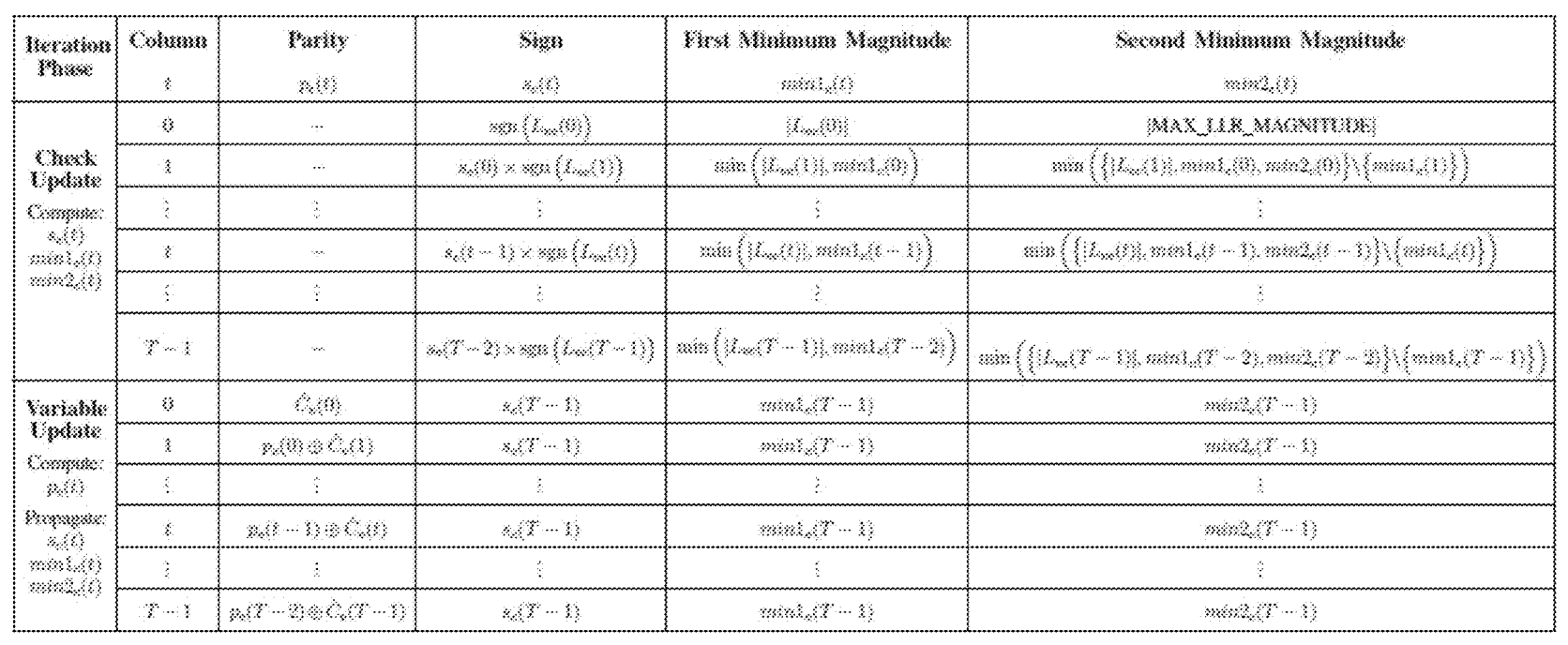

The parity check for early termination is also unrolled in time, as shown in FIG. 7(a-c) and FIG. 9. With this approach, by the time the parity result across all VNs in a CN path returns to the first CN-update in the next iteration, it is fully computed, thus eliminating the need for explicit parity-check processors, traditionally implemented as large XOR trees. Instead, a less complex, parallel logic-OR computation is performed on the arriving parity results in all CN paths at the starting column for each frame. The parallel OR computation only needs to be performed in the first column slice of a column slice pair between successive pipeline registers.

In order to minimize computational complexity for early termination checking, only one early termination check may be performed after 5 decoding iterations. This may lead to full decoder termination across all interleaved frames. If the early termination check does not pass after 5 iterations, the decoder iterates until the maximum number of iterations is reached, and then buffers out the final codewords. The maximum number of iterations may be any number. For example, the maximum number of iterations may be 10 iterations. This strategy may provide a trade-off between computational complexity and decoder latency, and ultimately improve the decoded throughput rate when early termination is achieved.

Aspects of this disclosure may be synthesized in a 40 nm CMOS process or any other suitable process. The $L_{vc}$ and $m_{cv}$ values may be floating point or quantized to any number of bits. For example, the $L_{vc}$ and $m_{cv}$ values may be 5 bits (1 sign bit, 4 magnitude bits).

The three column slice memory blocks are realized using memory-based register files instead of conventional flip-flops due to higher bit-cell density, which minimizes the overall decoder area and power. Despite the significant memory parallelism utilized in an exemplary architecture in accordance with the disclosure, the overall decoder scalability is improved due to the reduction in interconnect complexity and elimination of additional permutation logic at the memory periphery.

Aspects of the disclosure address the challenges of designing a multi-Gb/s LDPC decoder for short block lengths with low-overhead reconfigurability for multi-rate support. Aspects of the disclosure may reduce the global interconnect complexity by exploiting the cyclic relationship between successive columns in quasi-cyclic LDPC parity-check matrices. The reformulated flooding Min-Sum decoding schedule may enable pipelined frame interleaving by employing new combined processing nodes, which relax the CN-update, VN-update, and early termination timing constraints.

Design scalability may be achieved by remapping the global interconnect structure to less complex, local routing groups between column slices, and by leveraging the high bit-cell density of memory (e.g., SRAM, embedded DRAM, or future memory technologies) to compensate for the additional area overhead introduced by the frame-interleaved decoding schedule. Moreover, as the block length increases, the wiring permutation complexity between column slices does not increase for the same number of active processing layers, which define the closed check-node paths through the structure. Increasing the expansion factor of the cyclic Identity matrices, which comprise the base matrix, introduces additional parallel processing nodes and memory, but does not affect the decoder throughput or latency. The high degree of computational parallelism and low operating clock frequency further promote scalability for evolving, near-threshold voltage design techniques, where reliability at low supply voltages is a key challenge. By trading off interconnect complexity for high transistor area, architectures in accordance with this disclosure may be suitable for LDPC decoder design in CMOS nodes.

FIG. 8(a) shows another example LDPC parity-check matrix. In FIG. 8(a), parity-check matrix is not divisible into shifted Identity matrices. Therefore in FIG. 8(a), the expansion factor is 1, and the QC parity-check matrix is the same as the extended binary parity-check matrix. Each row of the parity-check matrix in FIG. 8(a) corresponds to a processing layer and a check node ($C_y$). Each column of the parity-check matrix in FIG. 8(a) corresponds to a processing column ($Col_x$) and a variable node ($V_x$). FIG. 8(b) shows a Tanner graph that corresponds to the exemplary LDPC parity-check matrix in FIG. 8(a). A "1" value located at (x, y) in the extended binary parity-check matrix of FIG. 8(a) indicates a connection between $CN_x$ and $VN_y$ in the Tanner graph of FIG. 8(b).

FIG. 8(c) presents an illustrative example of the interconnect routing patterns and combined processing unit arrangement for a LDPC decoder architecture as defined in FIG. 8(a). As shown in FIG. 8(c), the LDPC decoder may comprise column slice circuits in a pipeline arrangement, each column slice circuit corresponding to a column of the parity-check matrix in FIG. 8(a). Each column slice circuit may comprise one column processing node. Each column processing node may comprise three layer processors, each layer processor comprising a combination processing node (VN+CN).

FIG. 9 is a table of a piecewise time-distributed reformulation of the Min-Sum algorithm with a flooding schedule for a single layer routing path. At each column t out of T total columns, $P_c(t)$, $S_c(t)$, $min1_c(t)$ and $min2_c(t)$ are the intermediate results of the time-distributed, piecewise linear computation of Equations (7), (9), (10), and (11), respectively. For a complete traversal path over T total columns, the parity, sign, and minimum magnitude update computations performed at each processing node in column t are shown. In the first CN-update phase, the sign, first minimum magnitude, and second minimum magnitudes are updated sequentially with every combined processing node hop. In the second VN-update phase, the computed sign and minimum magnitudes are broadcast to all processing nodes in the path, while the parity is sequentially updated.

In one or more embodiment(s), piecewise reformulation does not alter the computational results of the Min-Sum algorithm, and therefore the error correction performance remains unaffected. Since the distributed update computations in each column are independent, multiple frames can be interleaved in the disclosed structure to ensure a constant workload over the uniformly partitioned processing nodes for maximum hardware utilization.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Accordingly, the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip. Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment(s) disclosed, but that the present invention will include all embodiments falling within the scope of the appended claims.

What is claimed is:

1. A method for Low-Density Parity-Check (LDPC) decoding, the method comprising: receiving a soft-decision input codeword block, wherein the probability of a bit being a "0" or a "1" is represented in the soft-decision input codeword block as a log-likelihood ratio (LLR); and iteratively updating the soft-decision input codeword block, by a sequence of hardware logic units, until a valid codeword is found or a maximum number of decoding iterations is reached, wherein each decoding iteration comprises a check node (CN) phase followed by a variable node (VN) phase, and wherein each hardware logic unit of the sequence of hardware logic units is operably coupled to receive input from a first other hardware logic unit of the sequence of hardware logic units and provide output to a second other hardware logic unit of the sequence of hardware logic units, wherein each hardware logic unit of the sequence of hardware logic units operates in series during the CN phase, thereby: generating a CN-to-VN message, generating an intermediate LLR and a VN-to-CN message according to the CN-to-VN message, and storing the VN-to-CN message in a memory for use during the CN phase in a next iteration, wherein each hardware logic unit of the sequence of hardware logic units operates in series during the VN phase, thereby performing a piecewise parity check, such that a final parity value across a plurality of connected VNs is determined by the last hardware logic unit of the sequence of hardware logic units.

2. The method for LDPC decoding of claim 1, wherein the soft-decision input codeword block corresponds to an LDPC encoded signal generated from a parity-check matrix having at least one all-zero sub-matrix.

3. The method for LDPC decoding of claim 2, wherein the method comprises bypassing a hardware logic unit according to the placement of the all-zero sub-matrix in the parity-check matrix.

4. The method for LDPC decoding of claim 1, wherein the method comprises iteratively update the soft-decision input codeword block during the VN phase of each decoding iteration of a plurality of decoding iterations.

5. The method for LDPC decoding of claim 1, wherein the method comprises propagating a plurality of intermediate CN update values during the CN phase of each decoding iteration of a plurality of decoding iterations.

6. The method for LDPC decoding of claim 5, wherein the plurality of intermediate CN update values comprises a parity value, a sign value, and at least one minimum magnitude value.

7. The method for LDPC decoding of claim 5, wherein the method comprises updating the CN-to-VN message according to the plurality of intermediate CN update values.

8. The method for LDPC decoding of claim 5, wherein the method comprises generating the VN-to-CN message according to the plurality of intermediate CN update values.

9. The method for LDPC decoding of claim 1, wherein the soft-decision input codeword block corresponds to an LDPC encoded signal generated from a parity-check matrix having a plurality of independent routing layers, wherein the plurality of independent routing layers are processed in parallel by each hardware logic unit of the sequence of hardware logic units.

10. The method for LDPC decoding of claim 1, wherein the soft-decision input codeword block corresponds to an LDPC encoded signal generated from a parity-check matrix having a plurality of columns, wherein the plurality of columns are processed in parallel by each hardware logic unit of the sequence of hardware logic units.

11. A Low-Density Parity-Check (LDPC) decoder, the LDPC decoder comprising: an interface operable to receive a soft-decision input codeword block, wherein the probability of a bit being a "0" or a "1" is represented in the soft-decision input codeword block as a log-likelihood ratio (LLR); a sequence of hardware logic units, each hardware logic unit comprising a check node (CN) update logic unit and a variable node (VN) update logic unit, wherein each hardware logic unit of the sequence of hardware logic units is operably coupled to receive input from a first other hardware logic unit of the sequence of hardware logic units and provide output to a second other hardware logic unit of the sequence of hardware logic units; a closed CN path between the CN update logic unit in each hardware logic unit of the sequence of hardware logic units, wherein the closed CN path is operable to propagate a plurality of intermediate CN update values during a first pass of each decoding iteration of a plurality of decoding iterations; and a closed VN path between the VN update logic unit in each hardware logic unit of the sequence of hardware logic units, wherein each VN update logic unit is operable to iteratively update the soft-decision input codeword block until a valid codeword is found or a maximum number of decoding iterations is reached.

12. The LDPC decoder of claim 11, wherein the soft-decision input codeword block corresponds to an LDPC encoded signal generated from a parity-check matrix having at least one all-zero sub-matrix.

13. The LDPC decoder of claim 12, wherein a hardware logic unit corresponding to the all-zero sub-matrix in the parity-check matrix comprises a CN update logic unit with bypass circuitry and a VN update logic unit with bypass circuitry.

14. The LDPC decoder of claim 11, wherein a CN update logic unit is operable to generate a CN-to-VN message and update an intermediate LLR according to the CN-to-VN message.

15. The LDPC decoder of claim 11, wherein the VN update logic unit in the last hardware logic unit of the sequence of hardware logic units is operable to determine whether the valid codeword is found based on a piecewise parity check performed via the closed VN path.

16. The LDPC decoder of claim 15, wherein the CN update logic unit is operable to update a CN-to-VN message according to the plurality of intermediate CN update values.

17. The LDPC decoder of claim 15, wherein the CN update logic unit is operable to generate a VN-to-CN message according to the plurality of intermediate CN update values.

18. The LDPC decoder of claim 11, wherein the plurality of intermediate CN update values comprises a parity value, a sign value, and at least one minimum magnitude value.

19. The LDPC decoder of claim 11, wherein the soft-decision input codeword block corresponds to an LDPC encoded signal generated from a parity-check matrix having a plurality of independent routing layers, wherein each hardware logic unit of the sequence of hardware logic units is operable to process the plurality of independent routing layers in parallel.

20. The LDPC decoder of claim 11, wherein the soft-decision input codeword block corresponds to an LDPC encoded signal generated from a parity-check matrix having a plurality of columns, wherein each hardware logic unit of the sequence of hardware logic units is operable to process the plurality of columns in parallel.

* * * * *